(12) United States Patent
Fried et al.

(10) Patent No.: US 7,550,361 B2
(45) Date of Patent: Jun. 23, 2009

(54) TRENCH STRUCTURE AND METHOD FOR CO-ALIGNMENT OF MIXED OPTICAL AND ELECTRON BEAM LITHOGRAPHIC FABRICATION LEVELS

(75) Inventors: David Michael Fried, Brewster, NY (US); John Michael Hergenrother, Ridgefield, CT (US); Sharee Jane McNab, Christchurch (NZ); Michael J. Rooks, Briarcliff Manor, NY (US); Anna Topol, Jefferson Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 11/618,957

(22) Filed: Jan. 2, 2007

(65) Prior Publication Data
US 2008/0157404 A1    Jul. 3, 2008

(51) Int. Cl.
H01L 21/76 (2006.01)
(52) U.S. Cl. .............................. 438/400; 257/E21.548
(58) Field of Classification Search .................. 438/400
See application file for complete search history.

(56) References Cited

U.S. PATENT DOCUMENTS

| | | | | | |
|---|---|---|---|---|---|
| 4,893,163 | A * | 1/1990 | Rudeck | ...................... | 257/797 |
| 4,927,775 | A * | 5/1990 | Alvarez et al. | .............. | 438/234 |
| 4,994,406 | A * | 2/1991 | Vasquez et al. | ............. | 438/426 |
| 5,065,217 | A * | 11/1991 | Verret | ........................ | 257/506 |
| 5,294,562 | A * | 3/1994 | Lur et al. | ..................... | 438/427 |
| 5,654,581 | A * | 8/1997 | Radosevich et al. | ......... | 257/534 |
| 6,004,834 | A * | 12/1999 | Tsukude et al. | ............. | 438/132 |
| 6,137,578 | A * | 10/2000 | Ausschnitt | .................. | 356/399 |
| 6,150,725 | A * | 11/2000 | Misawa et al. | .............. | 257/781 |
| 6,297,554 | B1 * | 10/2001 | Lin | ............................. | 257/752 |
| 6,406,976 | B1 * | 6/2002 | Singh et al. | ................. | 438/423 |
| 6,417,094 | B1 * | 7/2002 | Zhao et al. | ................... | 438/627 |
| 6,417,535 | B1 * | 7/2002 | Johnson et al. | ............. | 257/306 |
| 6,701,493 | B2 * | 3/2004 | Gasanov et al. | ................ | 716/4 |
| 6,723,600 | B2 * | 4/2004 | Wong et al. | ................. | 438/244 |
| 6,798,037 | B2 * | 9/2004 | Leonardi | ..................... | 257/507 |
| 6,812,141 | B1 * | 11/2004 | Gaidis et al. | ................ | 438/637 |
| 6,864,151 | B2 * | 3/2005 | Yan et al. | ..................... | 438/424 |
| 6,908,863 | B2 * | 6/2005 | Barns et al. | ................. | 438/700 |
| 6,955,972 | B2 * | 10/2005 | Lee et al. | .................... | 438/430 |
| 6,960,365 | B2 * | 11/2005 | Ning | ........................... | 427/79 |
| 7,166,535 | B2 * | 1/2007 | Li et al. | ...................... | 438/706 |
| 7,224,060 | B2 * | 5/2007 | Zhang et al. | ................. | 257/730 |
| 2003/0011030 | A1 * | 1/2003 | Xiang et al. | ................ | 257/347 |
| 2003/0068864 | A1 * | 4/2003 | Il-Yong et al. | ............. | 438/270 |
| 2003/0098492 | A1 * | 5/2003 | Singh et al. | ................. | 257/510 |
| 2003/0164532 | A1 * | 9/2003 | Liu et al. | .................... | 257/529 |
| 2004/0124546 | A1 * | 7/2004 | Saran et al. | ................. | 257/787 |

(Continued)

*Primary Examiner*—N Drew Richards
*Assistant Examiner*—Ankush K Singal
(74) *Attorney, Agent, or Firm*—Schmeiser, Olsen & Watts; Robert M. Trepp

(57) ABSTRACT

A method for aligning a first set of features of a fabrication level of an integrated circuit chip to an electron beam alignment target formed in a substrate and forming the first set of features using electron beam lithography and for aligning a second set of features of the same fabrication level of the integrated circuit chip to an optical alignment target formed in the substrate and forming the second set of features using photolithography, the optical alignment target itself is aligned to the electron beam alignment target. Also a method of forming and a structure of the electron beam alignment target.

21 Claims, 6 Drawing Sheets

U.S. PATENT DOCUMENTS

2006/0244029 A1* 11/2006 Moens et al. ............... 257/301
2006/0261444 A1* 11/2006 Grivna et al. ............... 257/576
2007/0224772 A1* 9/2007 Hall et al. ................... 438/400
2007/0238249 A1* 10/2007 Swift et al. ................. 438/259
2008/0012137 A1* 1/2008 Grivna et al. ............... 257/754

* cited by examiner

TRENCH STRUCTURE AND METHOD FOR CO-ALIGNMENT OF MIXED OPTICAL AND ELECTRON BEAM LITHOGRAPHIC FABRICATION LEVELS

FIELD OF THE INVENTION

The present invention relates to the field of semiconductor processing; more specifically, it relates to an alignment target and a method for co-alignment of mixed optical and electron beam lithographic fabrication levels.

BACKGROUND OF THE INVENTION

In order to fabricate an integrated circuit the various lithographically defined fabrications levels must be aligned to each other. In optical lithography, a layer of photoresist on a substrate is exposed to actinic radiation through a patterned photomask that is aligned to an alignment target on the substrate. Structures fabricated in earlier lithographic fabrication steps serve as these alignment targets for alignment marks on the photomasks. Electron beam lithography, by contrast is a direct-write process, there are no photomasks and the electron beam is scanned across an electron beam resist layer. For each fabrication level, the electron beam must be registered to a reference structure. In general, optical lithography is fast but cannot print images on very small pitches. Electron beam lithography can print images on very small pitches, but is slow. The benefits derivable from merging of these two technologies is hindered by the fact that electron beam lithographic systems cannot register to current optical alignment structures. Therefore, there is a need for an alignment target and method for co-alignment of optical and electron beam lithographic fabrication levels.

SUMMARY OF THE INVENTION

A first aspect of the present invention is a method, comprising: forming an electron beam alignment target in a substrate; forming an optical alignment target in the substrate after forming the electron beam alignment target, the optical alignment target positioned in a predetermined location in the substrate relative to a location of the electron beam alignment target in the substrate; forming a resist layer on the substrate; aligning a photomask to either the optical alignment target or to the electron beam alignment target, the photomask having a first pattern of clear and opaque regions representing a first set of features of a fabrication level of an integrated circuit; exposing the resist layer to actinic radiation through the photomask to form optically exposed regions in the resist layer, the opaque regions substantially blocking the actinic radiation and the clear regions substantially transmitting the actinic radiation; locating a home position of an electron beam relative to the location of the electron beam alignment target; exposing the resist to the electron beam in a second pattern to form electron beam exposed regions in the resist layer, the second pattern representing a second set of the features of the fabrication level of the integrated circuit; and developing the resist layer to transfer the first and second patterns to a resist pattern in the resist layer.

A second aspect of the present invention is the first aspect wherein the optical alignment target is a feature in the first set of features.

A third aspect of the present invention is the first aspect further including: transferring the resist pattern into the substrate or into a layer formed on the substrate.

A fourth aspect of the present invention is the first aspect wherein the step of aligning the photomask to either the optical alignment target or to the electron beam alignment target includes positioning an alignment mark on the photomask with respect to either the optical alignment target or to the electron beam alignment target, respectively.

A fifth aspect of the present invention is the first aspect wherein: (i) the exposing the resist layer to actinic radiation is performed before the exposing the resist layer to the electron beam; or (ii) the exposing the resist layer to the electron beam is performed before the exposing the resist layer to actinic radiation.

A sixth aspect of the present invention is the first aspect further including: dividing the surface of the substrate into virtual electron beam exposure fields; and forming additional electron beam alignment targets only within each region of the substrate that contains features that are members of the second set of features and have locations on the substrate that correspond to locations within the virtual electron beam exposure fields.

A seventh aspect of the present invention is the first aspect, wherein an area measured along a top surface of the substrate taken up by the electron beam alignment target is from 25 to 100 times an area measured along the top surface of the substrate taken up by the optical alignment target.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
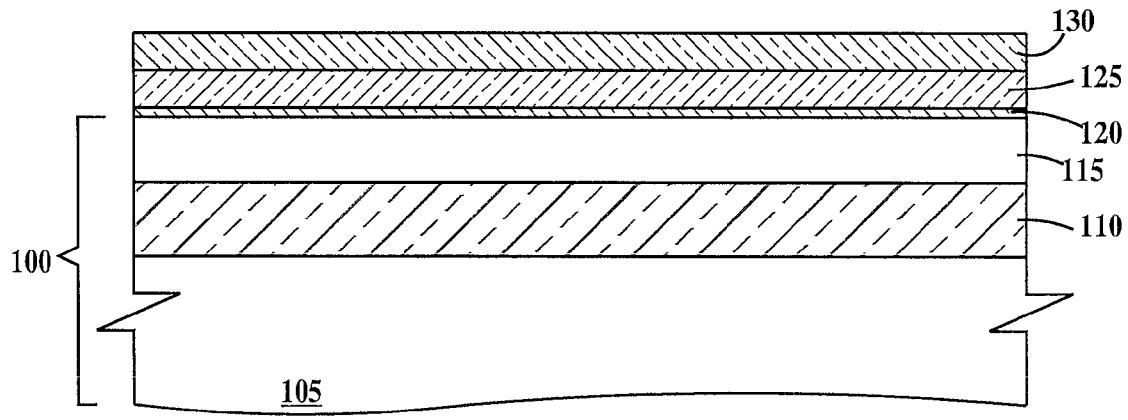
FIGS. 1A through 1K are cross-sectional drawings illustrating fabrication of an electron beam alignment target, an optical alignment target and an exemplary field effect transistor on the same substrate according to embodiments of the present invention.

Lithographic alignment is defined as the process of positioning different structures of an integrated circuit in horizontal directions (e.g. x-y position) with respect to each other and to a substrate on which the integrated circuit is being formed. A horizontal direction is defined as any direction parallel to the top surface of the substrate. A fabrication level of an integrated circuit is defined as a level that images a group of related patterned structures of the integrated circuit that are to be formed simultaneously in or on the substrate. A fabrication level may include two or more lithographic steps.

Optical lithography (herein after photolithography) forms a pattern of resist features and spaces in a resist layer by exposure of the resist layer to actinic radiation (e.g. ultraviolet light) through a photomask having a corresponding pattern of clear and opaque (to the actinic radiation) regions. Photolithographic alignment relies on positioning an image of an alignment mark on a photomask to an image of an alignment target on a substrate and moving either the photomask relative to the substrate or the substrate relative to the photomask in order to align the photomask (and the pattern on the mask) to the substrate (and structures on the substrate). Optical alignment targets have small horizontal dimensions (e.g. in the order of about 10 nm to about 100 nm, of limited depth (e.g. in the order of about 30 nm t to about 100 nm deep, and fabricated structures with low atomic weight (e.g. silicon).

Electron-beam lithography forms an image in a resist layer (with electron beam radiation) on a substrate by turning an electron beam off and on as the electron beam is scanned across the resist layer in a direct write process. Electron beam lithography alignment relies on locating a position on a substrate by imaging back-scattered electrons with scanning electron microscopy (SEM) relative to a home position of the electron beam in the electron beam exposure tool. The x-y location on the substrate directly in the path of the electron beam at any given time can then be determined. Electron beam alignment targets according to the embodiments of the present invention present a large topographical contrast (are large and deep) to the surrounding substrate area to increase the number of backscatter electrons that are used to generate a SEM image used to register the electron beam.

A photoresist is defined as a polymeric composition that is undergoes a chemical reaction changing its solubility in a developer when exposed to actinic ultraviolet radiation. An electron beam resist is defined as a polymeric composition that undergoes a chemical reaction changing its solubility in a developer when exposed to an electron beam. Resist is defined as a polymeric composition that undergoes a chemical reaction changing its solubility in a developer when exposed to actinic ultraviolet radiation or to an electron beam. Whenever a photoresist or electron beam resist is specified infra, a resist may be substituted.

While the embodiments of the present invention will be illustrated using a silicon-on-insulator (SOI) substrate, the embodiments of the present invention may be equally applied to bulk silicon substrates. Bulk silicon substrates do not include a buried oxide (BOX) layer. A common name for semiconductor substrates, bulk silicon or SOI, in the industry is "wafer" and the two terms substrate and wafer are used interchangeably in the industry. The terms integrated circuit and integrated circuit chip may be used interchangeably.

FIGS. 1A through 1K are cross-sectional drawings illustrating fabrication of electron beam alignment target, an optical alignment target and an exemplary field effect transistor (FET) on the same substrate according to embodiments of the present invention. In FIG. 1A, an SOI substrate (or wafer) 100 comprises a body (or handle) 105, a BOX layer 110 on top of the body and a silicon layer 115 on top of the BOX layer. BOX layer 110 comprises silicon dioxide. In one example body 105 is single-crystal silicon. In one example, silicon layer 115 is single crystal silicon. In one method, SOI wafers are formed by ion implantation of oxygen into a single-crystal silicon wafer and annealing to form a buried silicon dioxide layer. In another method, SOI wafers are formed by oxidizing the top surfaces of two silicon wafers, placing the oxidized surfaces in contact, annealing to bond the wafers together, and then removing silicon, for example, by chemical mechanical polish CMP) from the bottom of one of the wafers.

Formed on a top surface of silicon layer 115 is a first layer 120. Formed on a top surface of first pad layer 120 is a second pad layer 125. Formed on a top surface of second pad layer 125 is a hardmask layer 130. In one example first pad layer 120 is silicon dioxide. In one example, second pad layer 125 is silicon nitride. In one example, hardmask layer 130 is silicon dioxide. In one example, BOX layer 110 is from about 50 nm to about 300 nm thick. In one example, silicon layer 115 is from about 30 nm to about 200 nm thick. In one example, first pad layer 120 is from about 2 nm to about 20 nm thick. In one example, second pad layer 125 is from about 5 nm to about 150 nm thick. In one example, hardmask layer 130 is from about 50 nm to about 145 nm thick.

Figure 1B:
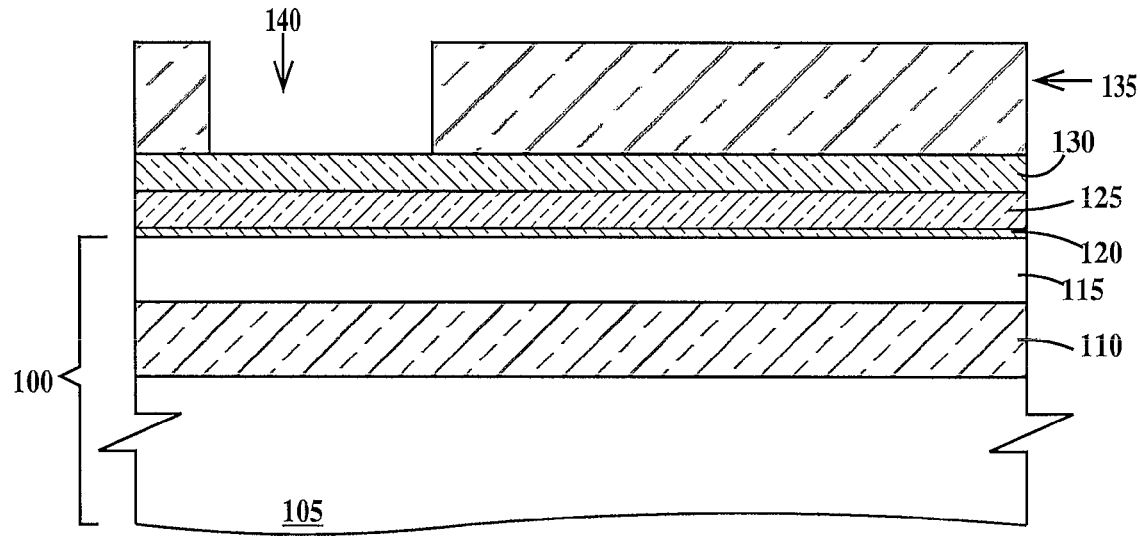

In FIG. 1B, a patterned photoresist layer 135 is formed on a top surface of the hardmask layer 130 and an opening 140 is photolithographically formed in the photoresist layer to expose a region of the hardmask layer in the bottom of the opening. This photolithography step defines locations and horizontal geometries of electron beam alignment targets that will be subsequently formed.

Figure 1C:
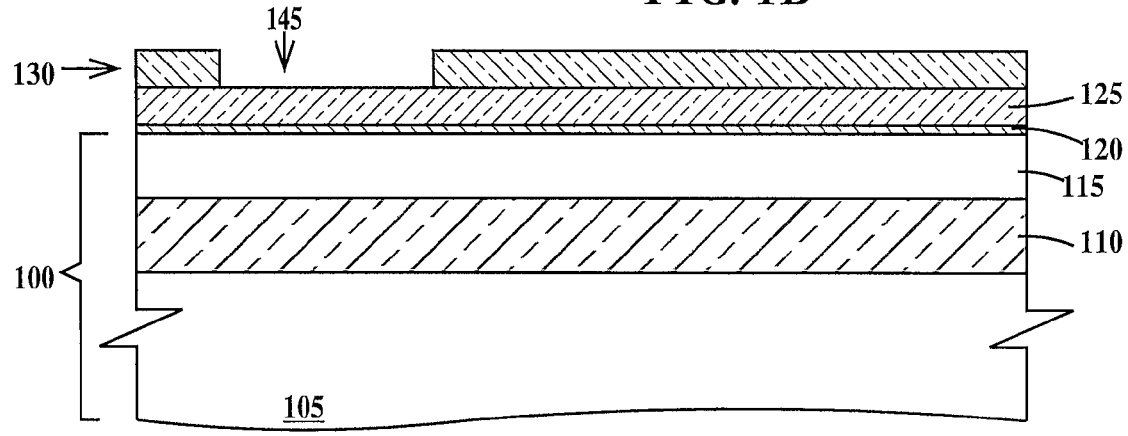

In FIG. 1C, hardmask layer 125 is etched using patterned photoresist layer 135 (see FIG. 1B) to form an opening 145 in the hardmask layer and the photoresist layer removed. Alternatively, any photoresist layer 135 remaining after etching hardmask layer 145 may be left in place to either be completely consumed by the operations described infra with respect to FIG. 1D or any remaining photoresist layer removed after those operations. A region of second pad layer 130 is exposed in the bottom of opening 145.

Figure 1D:
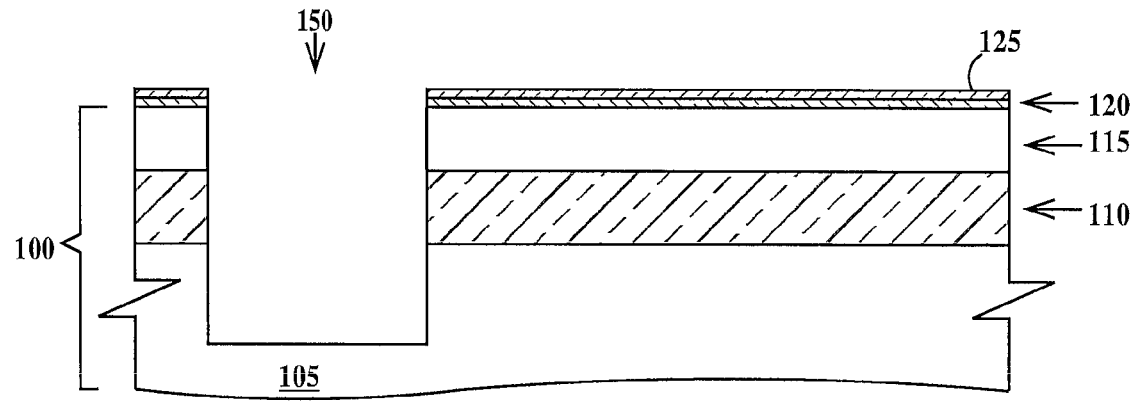

In FIG. 1D, a trench 150 is formed by etching through second pad layer 120, first pad layer 120, silicon layer 115, BOX layer 110 and into body 105. In the example that first pad layer 120 and BOX layer 110 are silicon diodoxide and second pad layer 125 is silicon nitride, two exemplary methods of etching trench 150 will be given. In a first method, a reactive ion etch (RIE) using $CF_4$ as a reactant gas is used to etch trench 150 in one step. In a second method, four steps are used. In a first step, an RIE using $CHF_3$ as a reactant gas is used to etch through second pad layer 125 and first pad layer 120. In a second step an RIE using HBr as a reactant gas is used to etch through silicon layer 115. In a third step, an RIE using $CHF_3$ as a reactant gas is used to etch through BOX layer 110. In a fourth step, an RIE using HBr as a reactant gas is used to etch into body 105. As illustrated in FIG. 1D, all of hardmask layer 130 (see FIG. 1C) is removed and most of second pad layer 120 is removed during the etching of trench 150. However, at one extreme example, a layer of hardmask layer 130 and all first and second pad layers 115 and 120 may remain after etching trench 155 and at an opposite extreme example, at least a layer of first pad layer 120 should remain to protect the top surface of silicon layer 115 from attack during the etching of trench 150. As mentioned supra, any remaining photoresist layer 135 (see FIG. 1C) is removed at this point.

Figure 1E:
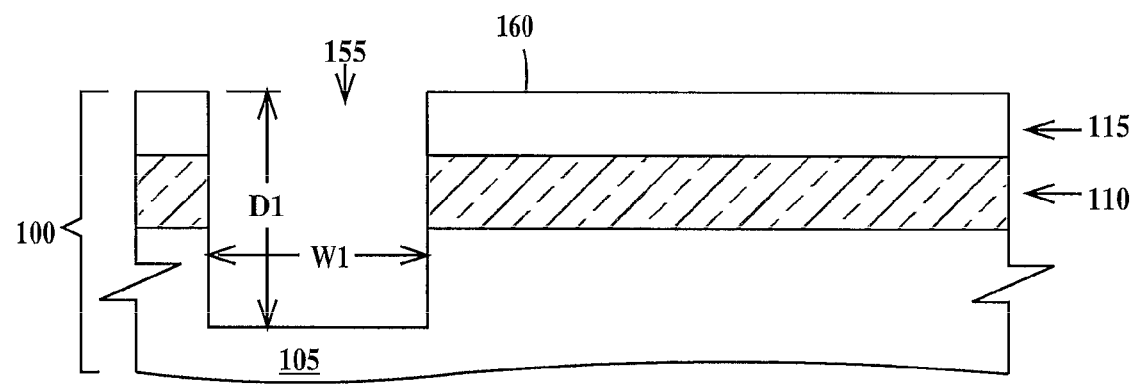

In FIG. 1E, any remaining hardmask layer (see FIG. 1C) and first and second pad layers 120 and 125 (see FIG. 1D) are removed, (e.g. by wet etching or a combination of wet etching and RIE) to form electron beam alignment target 155. Electron beam alignment target extends a depth into body 105 well below BOX layer 110. Electron beam alignment target 155 extends a depth D1 from top surface 160 of silicon layer 115 and has horizontal geometry having a minimum width in at least one horizontal direction of W1. In one example W1 is from about 0.5 microns to about 100 microns and D1 is about 1 micron or more. Thus, electron beam alignment target 155 comprises a relatively wide and deep (as compared to optical alignment targets and semiconductor devices described infra) trench structure extending below BOX layer 110 in body 105.

Electron-beam alignment target 155 backscatters more electrons along the sidewall edge of the trench forming the alignment target than from the bottom of the trench forming the alignment target. Because of the large perimeter and large trench depth of electron beam-alignment target 155, presents a large topographical contrast in SEM mode to the adjacent regions of substrate 100.

Figure 1F:
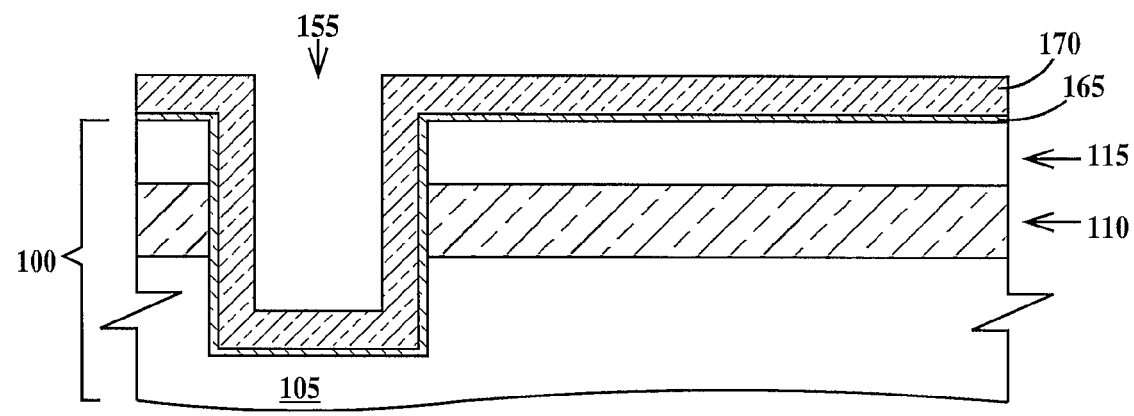

In FIG. 1F, a new first pad layer 165 is formed on all exposed surface of silicon layer 115 and all exposed surfaces of electron beam alignment target 155. Then a new second pad layer 170 is formed on all exposed surfaces of first pad layer 165. In one example first pad layer 165 is silicon dioxide. In one example, second pad layer 170 is silicon nitride. In one example, first pad layer 165 is from about 2 nm to about 20 nm thick. In one example, second pad layer 170 is from about 5 nm to about 150 nm thick.

Figure 1G:
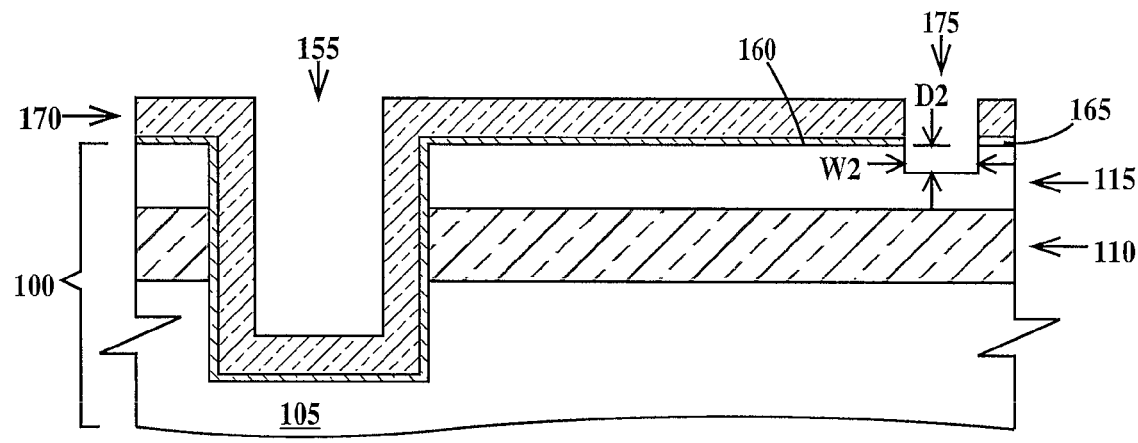

An optical alignment target may be formed at this point as illustrated in FIG. 1G, or be formed simultaneously with the first optically defined fabrication level. In one example, the first optically defined fabrication level is a dielectric filled trench isolation level as illustrated in FIG. 1H.

In FIG. 1G, an optical alignment target 175 is formed in silicon layer 115 by a photolithographic process which includes applying a photoresist layer, exposing the photoresist layer through a photomask aligned to electron beam alignment target 155, developing the exposed photoresist layer to pattern the photoresist followed by etching through first and second pad layers 165 and 170 into silicon layer 115, followed by removal of the photoresist layer. In one example, when second pad layer 170 is silicon nitride a RIE using $CHF_3$ as the reactant gas may be used to etch the second pad layer. In one example, when first pad layer 165 is silicon dioxide a RIE using $CHF_3$ as the reactant gas may be used to etch the first pad layer. In one example, a RIE using HBr as the reactant gas may be used to etch into silicon layer 115. First and second pad layers 165 and 170 protect electron beam alignment target 155 from subsequent processing steps.

Optical alignment target 175 extends a depth D2 from top surface 160 of silicon layer 115 and has horizontal geometry having a maximum width in at least one horizontal direction of W2. In one example W2 is from about 100 nm to about 5000 nm and D2 is from about 10 nm to about 500 nm. In the example illustrated in FIG. 1G, D2 may be equal to but not greater than the thickness of silicon layer 110. In a first example, optical alignment target 175 comprises a relatively narrow and shallow (as compared to electron beam alignment target 155) trench extending into silicon layer 115 but not contacting BOX layer 110. In a second example, optical alignment target 175 comprises a relatively narrow and shallow (as compared to electron beam alignment target 155) trench extending into silicon layer 115 and contacting BOX layer 110 In one example, the value of W2 (see FIG. 1E) is from 5 to 10 times the value of W1 and the surface area taken up by electron beam alignment target 155 is from 25 to 100 times the surface area taken up by optical alignment target 175.

Figure 1H:
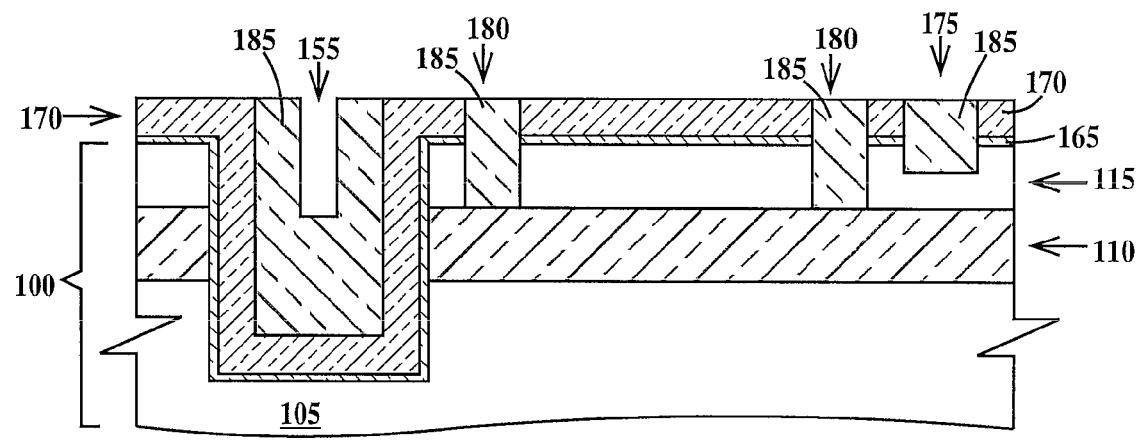

In FIG. 1H, shallow trench isolation (STI) 180 is formed through first and second pad layers 165 and 170 and silicon layer 115 down to BOX LAYER 110. In one example, first regions of the STI structure may be formed by a photolithographic process aligned to electron beam alignment target 155 and second regions of the STI may be formed by an electron beam lithographic process aligned to electron beam alignment target 155. Both lithographic processes include lithographically defining an STI pattern in a resist, etching trenches through first and second pad layers 165 and 170 and silicon layer 115, removing the resist layer depositing an insulator 185 to overfill the trenches and then performing a CMP. Insulator 185 is also deposited in electron beam alignment target 155 and optical alignment target 175. In one example, insulator 185 is CVD oxide. In one example insulator 185 is tetraethoxysilane (TEOS) oxide. With an SOI substrate, STI extends down to physically contact BOX layer 110. In the case of a bulk silicon substrate, STI 180 extends a designed distance into the bulk silicon substrate As mentioned supra, optical alignment target may be defined by either an electron beam lithographic process or a photolithographic process simultaneously with formation of STI 180. Optical alignment target 175 would then have a depth D2 (see FIG. 1G) equal to the depth of STI 180.

Figure 1I:
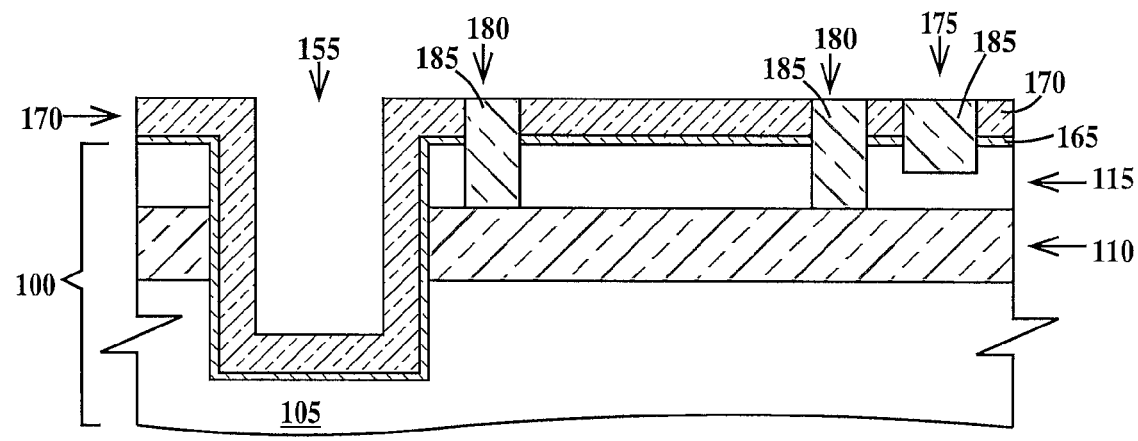

In FIG. 1I, an optional photolithographic step followed by etching is performed to remove insulator 185 (see FIG. 1H) from electron beam alignment target 155 without etching STI 180.

As illustrated in FIG. 1H, insulator 185 is left filling optical alignment target 175, but alternatively the insulator may also be removed from optical alignment target 175 with the same steps used to remove the insulator from the electron beam alignment target 155.

Figure 1J:
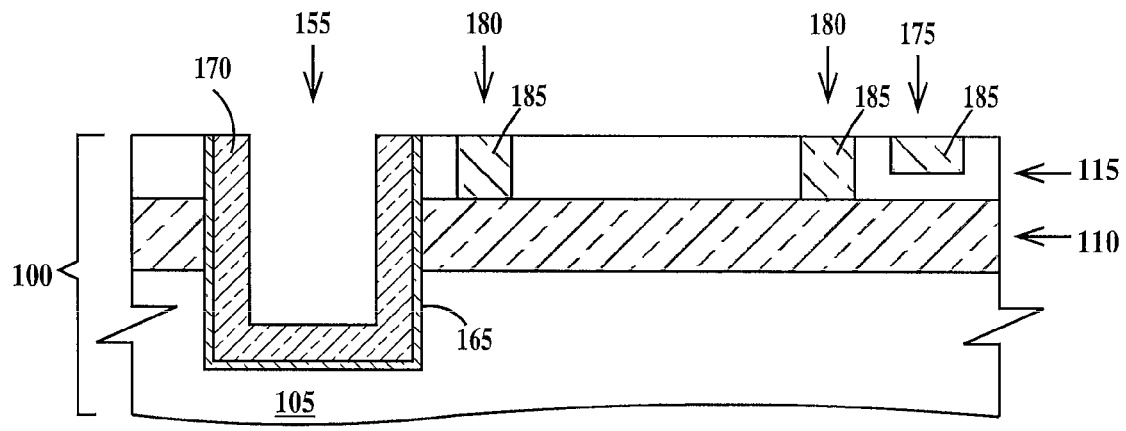
Figure 1K:
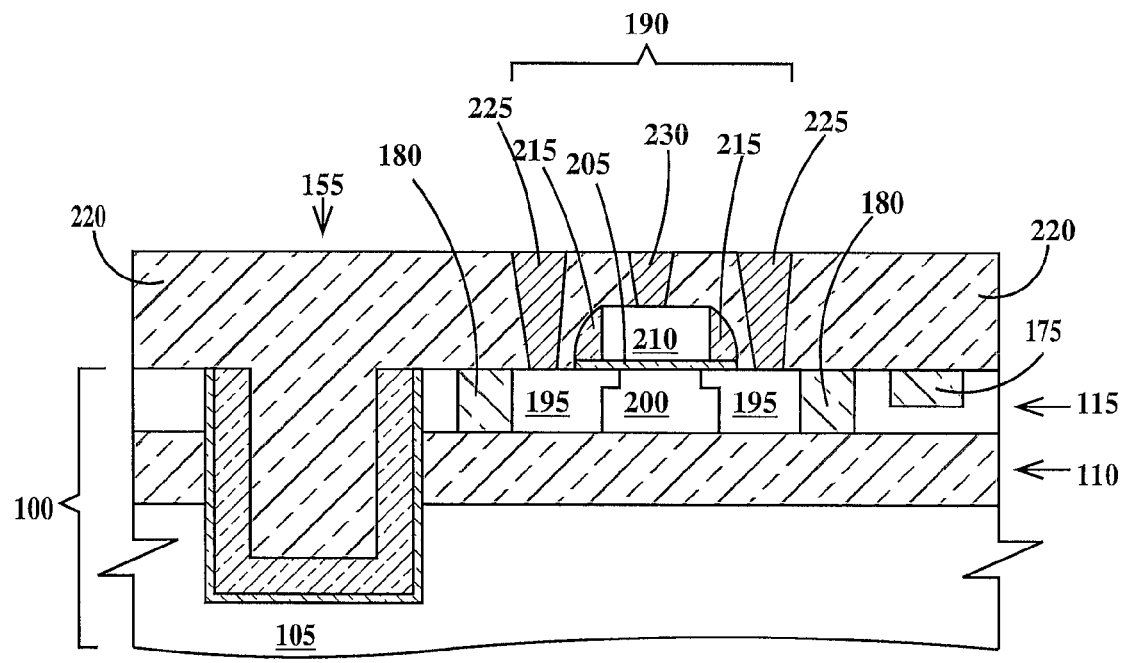

In FIG. 1J, preparatory to forming a gate stack for an FET, a CMP and a wet etch/clean are performed to remove the first and second pad layers from over silicon layer 115. In FIG. 1K, an FET 190 comprising source/drains 195 on opposite side of a channel region 200, a gate electrode 210 separated from the channel region by a gate dielectric 205, and optional spacers 215 is formed. Then an interlevel dielectric layer 220 is formed and electrically conductive source/drain contacts 225 and an electrically conductive gate electrode contact 230 are formed in the interlevel dielectric layer. In one example contacts 225 and 230 are formed by a damascene process.

A damascene process is one in which wire trenches, via or contact openings are formed in a dielectric layer, an electrical conductor of sufficient thickness to fill the trenches is deposited on a top surface of the dielectric, and a CMP process is performed to remove excess conductor and make the surface of the conductor co-planar with the surface of the dielectric layer to form damascene wires, vias or contacts.

Generally, additional dielectric layers containing electrically conductive wires and vias are formed over dielectric layer 220 in order to wire individual semiconductor devices into an integrated circuit.

In the fabrication of FET 190, certain features of the FET and contacts may be formed in electron beam lithographic steps using electron beam alignment target 155 and certain features of the FET and contacts may be formed in photolithographic steps using optical alignment target 175. All electron beam lithography steps use electron beam alignment target 155. Most commonly, photolithographic steps use optical alignment target 175 or other subsequently formed optical targets formed after optical alignment target 175 is formed. These subsequently formed optical alignment targets may be aligned to either electron beam alignment target 155, optical alignment target 175, or other optical alignment targets that have been aligned to optical alignment target 175. FET 190 is not to scale relative to electron beam alignment target 155 or optical alignment target 175. In one example, FET 190 has an horizontal area of about 36000 (e.g. 60×600) $nm^2$ which is from about 3 to about 300 times smaller than the horizontal area of electron beam alignment target 155.

FET 190, should be considered exemplary of devices that may be formed in/on substrate 100 which include, but is not limited to diodes, bipolar transistors, SiGe transistors, other hetero-junction transistors, resistors, capacitors and inductors. It should also be understood that there are many lithographic fabrication steps required to produce semiconductor devices and there are many lithographic fabrication steps required to interconnect these devices into integrated circuits and that all these lithographic steps are aligned to either electron beam alignment target 155, optical alignment target 175 or both as described infra in reference to FIG. 3.

Figure 2:
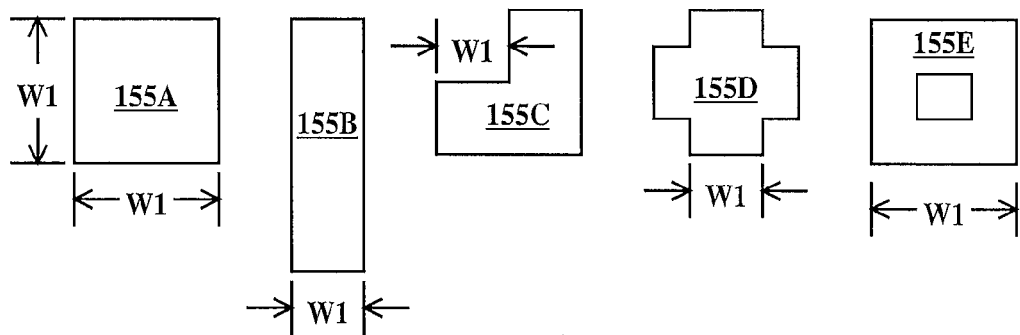
FIG. 2 illustrates various geometric shapes that electron beam alignment targets according to the embodiments of the present invention may take.

FIG. 2 illustrates various geometric shapes that electron beam alignment targets according to the embodiments of the present invention may take. In FIG. 2, exemplary horizontal geometries (i.e. top views, plan views) electron beam alignment targets are illustrated. Electron beam alignment target 155A is square with each side having a length W1. Electron beam alignment target 155B is rectangular with the shortest side having a length W1. Electron beam alignment target 155C is "L" shaped with the "foot" of the "L" having a length W1. Electron beam alignment target 155D is cross-shaped with each arm of the cross having a width W1. Electron beam alignment target 155E is a square ring with each outer side having a length W1.

Currently, the largest optical field size is about 20 mm by about 20 mm and the largest electron beam field size that may be printed is about 0.3 mm by about 0.3 mm. In the example of a single integrated circuit chip of about 10 mm by about 10 mm, there is only one optical exposure field required and about 1200 corresponding electron beam exposure fields. In many cases, when the optical exposure field is sufficiently greater than the chip size, multiple chips are printed at the same time in the same optical exposure field.

Currently, the smallest pitch of patterns printable by photolithography is about 200 nm and the smallest pitch of patterns printable by electron beam lithography is about 70 nm. Thus on levels containing even a small number of features having a pitch less than 200 nm, electron beam lithography must be used. It is advantageous for fabrication levels that contain patterns pitches printable with photolithography as well as patterns not printable with photolithography but printable with electron beam lithography, to print the regions printable with photolithography with photolithographic processes and to print the regions not-printable with photolithography with electron beam lithographic processes rather than printing the entire fabrication level with electron beam lithography.

Figure 3:
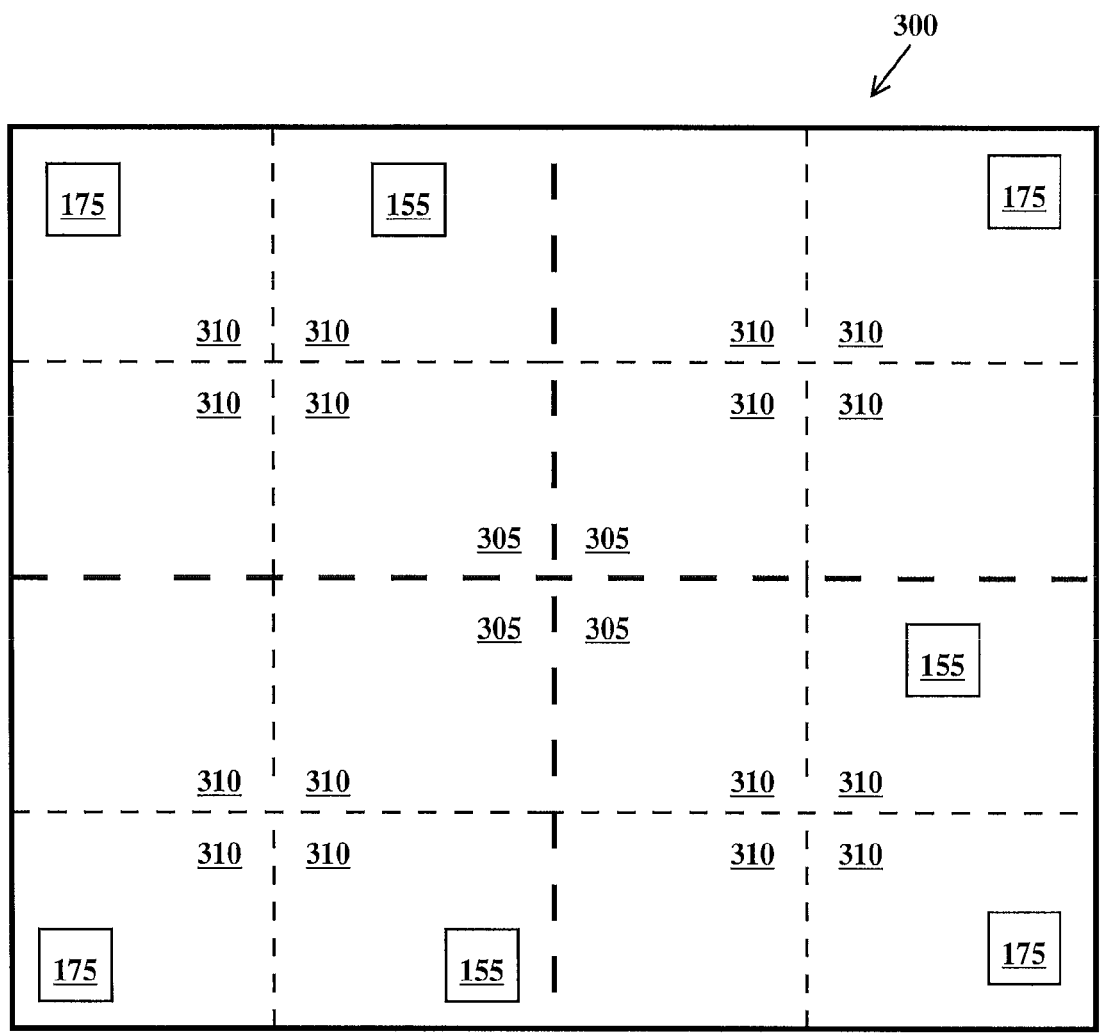
FIG. 3 is a top view of an exemplary integrated circuit chip illustrated the spatial relationships between optical and electron beam exposure fields and optical and electron beam alignment targets according to the embodiments of the present invention.

FIG. 3 is a top view of an exemplary integrated circuit chip illustrated the horizontal spatial relationships between optical and electron beam exposure fields and optical and electron beam alignment targets according to the embodiments of the present invention. In FIG. 3, an exposure field 300 is divided into multiple (e.g. four in FIG. 3) integrated circuit chips each containing an optical alignment target 175. Each integrated circuit chip 305 is virtually divided into multiple (e.g. four in FIG. 3) electron beam exposure fields 310. However, not each electron beam exposure field includes an electron beam alignment target 155, only selected electron beam exposure fields.

Only those electron beam exposure fields in which an electron beam lithography process will be performed contain electron beam alignment targets 155. In the regions without electron beam alignment targets 155, only photolithographic processes will be performed. However, it should be understood that photolithographic processes may be performed in electron beam exposure field that contain electron beam alignment targets 155.

The top view of integrated circuits 305 in FIG. 3 are also known as a floor plan views, floor plan designs or floor plan layouts of integrated circuits 305, and electron beam alignment targets 155, optical alignment targets 175 and all integrated circuit structures and features (not shown in FIG. 3) of all fabrication levels of integrated circuits 305 are positioned in locations relative to a locations of electron beam alignment targets 155 (and thus to optical alignment targets 175 and each other) and have coordinates on a set of X-Y coordinates mapped on the floor plan.

It should be noted, that every electron beam exposure field 310 containing an electron beam alignment target 155 does not have to be printed with electron beam lithography, only those having pattern pitches not printable with photolithography. However, all electron beam alignment targets 155 that will be used at fabrication different levels are all fabricated together at the very beginning of the fabrication process as describe supra. Examples of fabrication levels on an integrated circuit that may contain regions that electron beam lithography would be used for include, but is not limited to STI levels (because silicon regions are defined as well as STI regions), gate electrode levels of FETs, emitter levels of bipolar transistors, contact levels (the interconnection level between devices and the first true wiring level) and the first wiring level.

Figure 4:
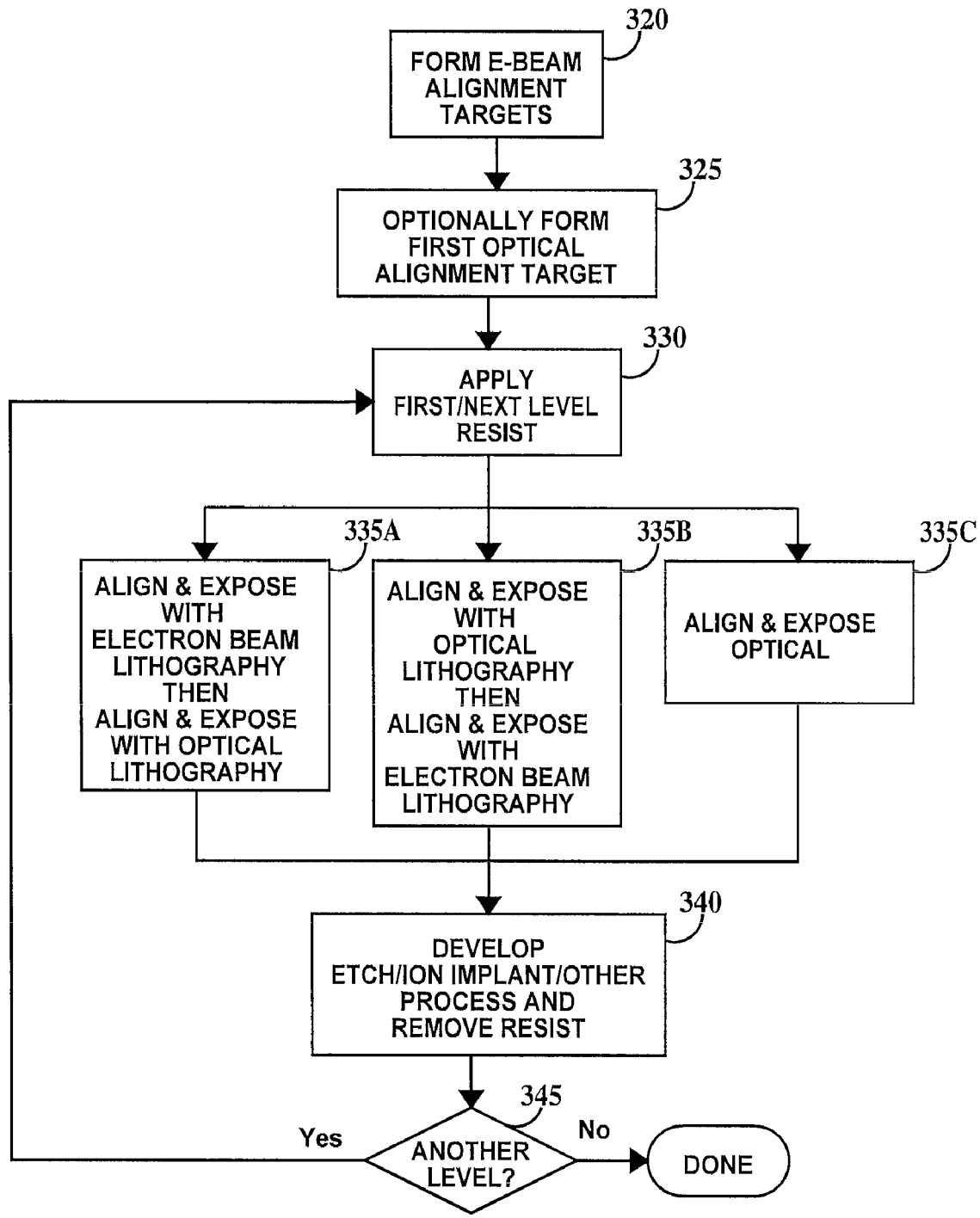
FIG. 4 is a flowchart for fabrication of an integrated circuit using both optical and electron beam lithography according to the embodiments of the present invention.

FIG. 4 is a flowchart for fabrication of an integrated circuit using both optical and electron beam lithography according to the embodiments of the present invention. In step 320, electron beam alignment targets are formed in a semiconductor substrate in all regions of an integrated circuit chip that are to be processed with electron beam lithography at any lithographically defined fabrication level.

In step 325, a first optical alignment target is optionally formed in the substrate aligned to the electron beam alignment target. If an optical alignment target is not formed in step 320, then the first time through any of steps 335A, 335B or 335C an optical alignment target is formed aligned to the electron beam alignment target along with the first lithography level integrated circuit images.

Next in step 330, a resist layer is applied to the substrate. The method them proceeds to either of steps 335A, 335B or 335C. If the method proceeds to step 335A or 335B a dual-exposure resist (i.e. a resist that is exposable by electron beam or light) is used. If the method proceeds to step 335C then either a dual-exposure resist is used or a photoresist (i.e. a light exposable resist).

In step 335A, an electron beam lithographic exposure is performed using the electron beam alignment target followed by a photolithographic exposure using an optical alignment target previously formed or using the electron beam alignment target. The method then proceeds to step 340.

In step 335B, a photolithographic exposure using an optical alignment target previously formed or using the electron beam alignment target followed by an electron beam lithographic exposure performed using the electron beam alignment target. The method then proceeds to step 340.

In step 335C, a photolithographic exposure is performed using an optical alignment target previously formed or using the electron beam alignment target. The method then proceeds to step 340.

In step 340, the resist is exposed and developed, etching, ion implantation or other processing is performed and the resist is removed. If this is the first lithographically defined fabrication level of the integrated circuit chip (e.g. the level STI is defined at) and if the first optical alignment target has not yet been formed, then step 340 defines the first optical alignment target in the substrate. If the first optical alignment target is fabricated in step 345 it may be defined by either electron beam lithography or photolithography.

In step 345 it is determined if another lithographically defined fabrication level is required. If another fabrication level is required the method loops back to step 330, otherwise the method as to lithographically defined fabrication levels of an integrated circuit chip is done.

Instead if exposing a single layer of resist optically and with an electron beam, a two "resist" process on the same fabrication level may be performed. In a first example, an electron beam lithographic process is performed using an electron beam resist and an electron beam alignment target, the electron beam resist developed, and the pattern in the electron beam resist transferred into the substrate or layer on the substrate. Then, a photolithographic process is performed using photoresist and an electron beam alignment target or an optical alignment target, the photoresist developed, and the pattern in photoresist transferred into the same substrate or layer on the substrate. In a second example, a photolithographic process is performed using photoresist and an electron beam alignment target or an optical alignment target, the photoresist developed, and the pattern in photoresist transferred into the substrate or layer on the substrate. Then an electron beam lithographic process is performed using an electron beam resist and an electron beam alignment target, the electron beam resist developed, and the pattern in the electron beam resist transferred into the same substrate or layer on the substrate.

Thus, the embodiments of the present invention provide an alignment target and method for co-alignment of optical and electron beam lithographic fabrication levels.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating an integrated circuit chip, comprising:
   forming a first pad layer on a top surface of a semiconductor substrate;
   forming a hardmask layer on a top surface of said pad layer;
   etching an opening in said hardmask layer, a region of said top surface of said pad layer exposed in a bottom of said opening;
   etching a first trench through said pad layer exposed in said opening in said hardmask into said substrate, said first trench located in a first position on said substrate relative to a floor plan of said integrated circuit chip;
   completely removing said hardmask layer and said first pad layer;
   forming a second pad layer on said top surface of said substrate and on sidewalls and a bottom surface of said first trench;
   locating one or more second trenches in respective one or more second positions on said substrate relative to said floor plan layout of said integrated circuit chip and etching said one or more second trenches through said second pad layer into said substrate;
   at least partially filling said first trench and simultaneously completely filling said one or more second trenches with an insulator; and
   removing said insulator from said first trench.

2. The method of claim 1, further including:
   simultaneously with said locating said one or more second trenches, locating a third trench in a third position on said substrate relative to said floor plan layout of said integrated circuit chip;
   simultaneously with said etching said first trench, etching said third trench through said pad layer into said substrate; and
   simultaneously with said filling said one or more second trenches, completely filling said third trench with said insulator.

3. The method of claim 1, further including:
   after forming said second pad layer and before forming said one or more second trenches, forming a third trench in said substrate, said third trench positioned in a third predetermined location relative to said first location of said first trench.

4. The method of claim 1, wherein said first trench extends from said top surface of said substrate a first distance that is greater than a second distance that said one or more second trenches extend into said substrate from said top surface of said substrate.

5. The method of claim 1, further including:
   said substrate comprising a buried oxide layer, a silicon layer and a body, said buried oxide layer located between said silicon layer and said body, a top surface of said silicon layer being said top surface of said substrate;
   said first trench extending through said silicon layer, through said buried oxide layer and into said body; and
   each of said one or more second trenches extending only through said silicon layer to contact said buried oxide layer.

6. The method of claim 2, further including:
   forming an additional layer on top of said second pad layer;
   locating fourth positions on said additional layer relative to said floor plan layout of said integrated circuit chip; and
   forming patterns in said additional layer at respective said fourth positions.

7. The method of claim 6, wherein said forming patterns in said additional layer includes exposing a resist layer on a top surface of said additional layer though a photomask to ultraviolet light.

8. The method of claim 6, wherein said forming patterns in said additional layer includes exposing a resist layer on a top surface of said additional layer to electron beam radiation.

9. The method of claim 6, further including:
   locating fifth positions on said additional layer relative to said floor plan layout of said integrated circuit chip; and
   forming additional patterns in said additional layer at respective said fifth positions.

10. The method of claim 6, further including:
    locating fifth positions on said additional layer relative to said floor plan layout of said integrated circuit chip; and
    forming additional patterns in said additional layer at respective said fifth positions.

11. The method of claim 9, wherein said forming additional patterns in said additional layer includes exposing a resist layer on a top surface of said additional layer though a photomask to ultraviolet light.

12. The method of claim 9, wherein said forming additional patterns in said additional layer includes exposing a resist layer on a top surface of said additional layer to electron beam radiation.

13. The method of claim 10, wherein said forming additional patterns in said additional layer includes exposing a resist layer on a top surface of said additional layer though a photomask to ultraviolet light.

14. The method of claim 3, further including:
    forming an additional layer on top of said second pad layer;
    locating fourth positions on said additional layer relative to said floor plan layout of said integrated circuit chip; and
    forming patterns in said additional layer at respective said fourth positions.

15. The method of claim 14, wherein said forming patterns in said additional layer includes exposing a resist layer on a top surface of said additional layer though a photomask to ultraviolet light.

16. The method of claim 14, wherein said forming patterns in said additional layer includes exposing a resist layer on a top surface of said additional layer to electron beam radiation.

17. The method of claim 14, further including:
   locating fifth positions on said additional layer relative to said floor plan layout of said integrated circuit chip; and
   forming additional patterns in said additional layer at respective said fifth positions.

18. The method of claim 17, wherein said forming additional patterns in said additional layer includes exposing a resist layer on a top surface of said additional layer though a photomask to ultraviolet light.

19. The method of claim 17, wherein said forming additional patterns in said additional layer includes exposing a resist layer on a top surface of said additional layer to electron beam radiation.

20. The method of claim 14, further including:
   locating fifth positions on said additional layer relative to said floor plan layout of said integrated circuit chip; and
   forming additional patterns in said additional layer at respective said fifth positions.

21. The method of claim 20, wherein said forming additional patterns in said additional layer includes exposing a resist layer on a top surface of said additional layer though a photomask to ultraviolet light.

* * * * *